United States Patent
Sevenhans et al.

(10) Patent No.: US 6,940,920 B2
(45) Date of Patent: Sep. 6, 2005

(54) MULTIPLIER ARRANGEMENT, SIGNAL MODULATOR AND TRANSMITTER

(75) Inventors: Joannes Mathilda Josephus Sevenhans, Brasschaat (BE); Bart Verstraeten, Melle (BE); Silvio Taraborrelli, Souvret (BE)

(73) Assignee: Alcatel, Paris (FR)

( * ) Notice: Subject to any disclaimer, the term of this patent is extended or adjusted under 35 U.S.C. 154(b) by 788 days.

(21) Appl. No.: 09/855,496

(22) Filed: May 16, 2001

(65) Prior Publication Data

US 2002/0018534 A1 Feb. 14, 2002

(30) Foreign Application Priority Data

May 17, 2000 (EP) .............................................. 00401370

(51) Int. Cl.[7] .............................................. H04L 27/36
(52) U.S. Cl. ....................... 375/298; 708/620; 708/835; 327/357; 327/359
(58) Field of Search ................................. 375/259, 261, 375/298; 370/206; 455/110, 112, 550; 708/620–632, 835; 327/356–359

(56) References Cited

U.S. PATENT DOCUMENTS 4,726,039 A 2/1988 Piesinger
5,802,111 A * 9/1998 Diehl et al. .................. 375/259

OTHER PUBLICATIONS

Jan Sevenhans et al, Trends in silicon radio Large Scale Integration: Zero IF Receiver! Zero I & Q Transmitter! Zero Discrete Passives!, Topics in Circuits for Communications, IEEE Communications Magazine, Jan. 2000, vol. 38, No. 1, pp. 142–147.

T. Tsukahara et al, "A 2V 2GHZ–SI Bipolar Direct–Conversion Quadrature Modulator", IEEE International Solid State Circuits Conference, vol. 37, Feb. 16, 1994, pp. 40–41, 306 XP000507053.

A. Boveda et al, "A 0.7–3 GHZ GAAS QPSK/QAM Direct Modulator", IEEE Journal of Solid–State Circuits, vol. 28, No. 12, Dec. 1993, pp. 1340–1349, XP000435908.

K. Feher et al, Constant Envelope Bandlimited BPSK Signal, IEEE Transactions on Communications, vol. COM–28, No. 6, Jun. 1980, pp. 889–897, XP000758583.

* cited by examiner

*Primary Examiner*—Amanda T. Le
(74) *Attorney, Agent, or Firm*—Sughrue Mion, PLLC

(57) ABSTRACT

A multiplier arrangement (MUXER) is adapted to generate from analog phase information and from high-frequency local oscillator signals, components of a high-frequency phase vector (PV), and to synthesise said high-frequency phase vector (PV) from said components within a summing means is further adapted to provide said high-frequency phase vector (PV) as a vector which is making an excursion alongside the contours of a square within the complex plane during a first category of predetermined transitions of a phase signal ($\phi$) on which said analog phase information is dependent. A signal modulator including such a multiplier arrangement as well as a transmitter are described as well.

18 Claims, 5 Drawing Sheets

MULTIPLIER ARRANGEMENT, SIGNAL MODULATOR AND TRANSMITTER

BACKGROUND OF THE INVENTION

The present invention relates to a multiplier arrangement comprising a pair of input terminals to which analog phase information is provided. The multiplier arrangement receives a set of high-frequency local oscillator signals (LO1, LO2, LO3, LO4) which are 90 degrees in phase shifted with respect to each other and the multiplier arrangement generates, from the analog phase information and from the high-frequency local oscillator signals, components of a high-frequency phase vector (PV).

Multiplier arrangements are already known in the art, e.g. from the article "Trends in Silicon Radio Large Scale Integration: Zero IF Receiver! Zero I & Q Transmitter! Zero Discrete Passives!" by J. Sevenhans, B. Verstraeten and S. Taraborrelli, IEEE Communications Magazine, January 2000 Vol. 38, Nr. 1, pp 142–147. Therein, in FIG. 5 on page 144, a traditional Cartesian I and Q transmit modulator is shown, including two blocks indicated with an "X" as well as a device, indicated with a "+". The two blocks denoted "X" are mixers in a traditional I/Q transmit modulator, each of them thereby receiving a respective pair of high frequency local oscillator signals, as well as a respective one of the Cartesian components of the analog phase information, namely $\sin(\phi)$ and $\cos(\phi)$. Each of them generates from its respective Cartesian component, as well as from its respective local oscillator signals, a corresponding component of a high-frequency phase vector. These two components are subsequently added in the block denoted "+", to be considered as corresponding to the summing means of the multiplier arrangement under consideration.

A drawback of this prior art multiplier arrangement is that it consumes a lot of power, since both mixers are continuously active during the whole operation of this arrangement. Furthermore, a linear power amplifier is needed since these mixers themselves are performing also an image rejection operation. Linear power amplifiers, however, are very power consuming.

SUMMARY OF THE INVENTION

It is therefore an aspect of the present invention to present a multiplier arrangement of the above known kind, but consuming less power.

The synthesized high-frequency phase vector of the present invention is following a square during a first category of predetermined transitions of the phase signal ($\phi$). This not only results in a 50% power reduction, but this solution allows for a less linear power amplifier, thereby again reducing the total power consumption of the complete transmitter.

A further characteristic feature of the present invention is a multiplier arrangement that provides the high-frequency phase vector as a vector which is making an excursion alongside the diagonals of the square during a second category of predetermined transitions of the phase signal ($\phi$) which is different from the first category of predetermined transitions.

By not only making an excursion on the square, but also on the diagonals of this square, QPSK modulation schemes can be followed, adding to the versatility of the arrangement.

Another characteristic feature of the present invention is that the multiplier arrangement receives a set of differential high frequency local oscillator signals (LO1-LO3, LO2-LO4, LO3-LO1, LO4-LO2) and includes a pair of output terminals on which the high-frequency phase vector (PV) is provided as a differential high-frequency phase vector.

Yet a further characteristic feature of the present invention is that the multiplier arrangement comprises a plurality of multipliers (M1,M2,M3,M4) and each multiplier has a respective input terminal (inm1, inm2, inm3, inm4) that is coupled to a first terminal of an associated switch (SW1, SW2, SW3, SW4), a second terminal of the associated switch being coupled to one of the pair of input terminals of the multiplier arrangement or to the ground reference terminal by a respective control signal (c1, c2, c3, c4).

A simple embodiment including a set of multipliers, each being controlled by the operation of a switch, is obtained. Each of the multipliers is delivering respective ones of the components of the phase vector.

Further characteristic features of the present invention are a multiplier that includes a differential pair of transistors (T11, T12), and the control terminals of the transistors receive respective components of a differential high-frequency local oscillator signal of from the set of differential high-frequency local oscillator signals. First conductive terminals of the transistors are coupled to the output terminal of a transconductor circuit (TC), of which an input terminal is coupled to an input terminal (inm1) of the multiplier, and second conductive terminals of the differential pair are coupled to input terminals of the summing means. The transconductor circuit (TC) comprises a transistor (T13), a control terminal of which is coupled to an input terminal of said transconductor circuit, a first conductive terminal of which is coupled to the ground reference terminal via an impedance device (R1), and a second conductive terminal of which is coupled to the output terminal of the transconductor circuit.

A very simple and cost-effective implementation at transistor level is obtained.

The present invention relates to a signal modulator comprising a multiplier arrangement of the present invention as well as an additional envelope limiter adapted to transform the high-frequency phase vector into a high-frequency output signal.

This envelope limiter has the function to convert the path followed by the phase vector from a square one into a circle. This allows for constant envelope GMSK modulation schemes, which are needed in GSM applications.

The signal modulator comprises control circuitry for the provision of the respective control signals, for control of the operation of the switches of the multiplier arrangement.

The control circuit is adapted to generate respective control signals such as to control these switches in such a way as to activate only a maximum of two multipliers at a time. Compared to the prior art case, whereby each of the mixers comprises two comparable multipliers, and whereby these two mixers and thus consequently four of such comparable multiplier structures were thus active all the time, the present solution is very power-efficient, while at the same time very simple.

A simple embodiment at transistor level of a full differential envelope limiter comprises a differential pair of transistors, respective control terminals of which are coupled to the output terminals of the multiplier arrangement, first conductive terminals of which are coupled to the output terminal of a bias circuit (BC), and respective second conductive terminals of which are coupled to a pair of differential output terminals of the envelope limiter (EL)

and being coupled to the supply voltage terminal (Vcc) via impedance devices.

The present invention relates as well to a transmitter including the subject signal modulator and multiplier arrangement.

The present invention further comprises a read-only memory device (ROMm) coupled to a digital-analog converter (DAC) as an analog pulse shaper, adapted to generate the analog phase information.

BRIEF DESCRIPTION OF THE DRAWINGS

The above mentioned and other aspects and features of the invention will become more apparent and the invention itself will be best understood by referring to the following description of an embodiment taken in conjunction with the accompanying drawings wherein.

DETAILED DESCRIPTION OF THE INVENTION

Figure 1:
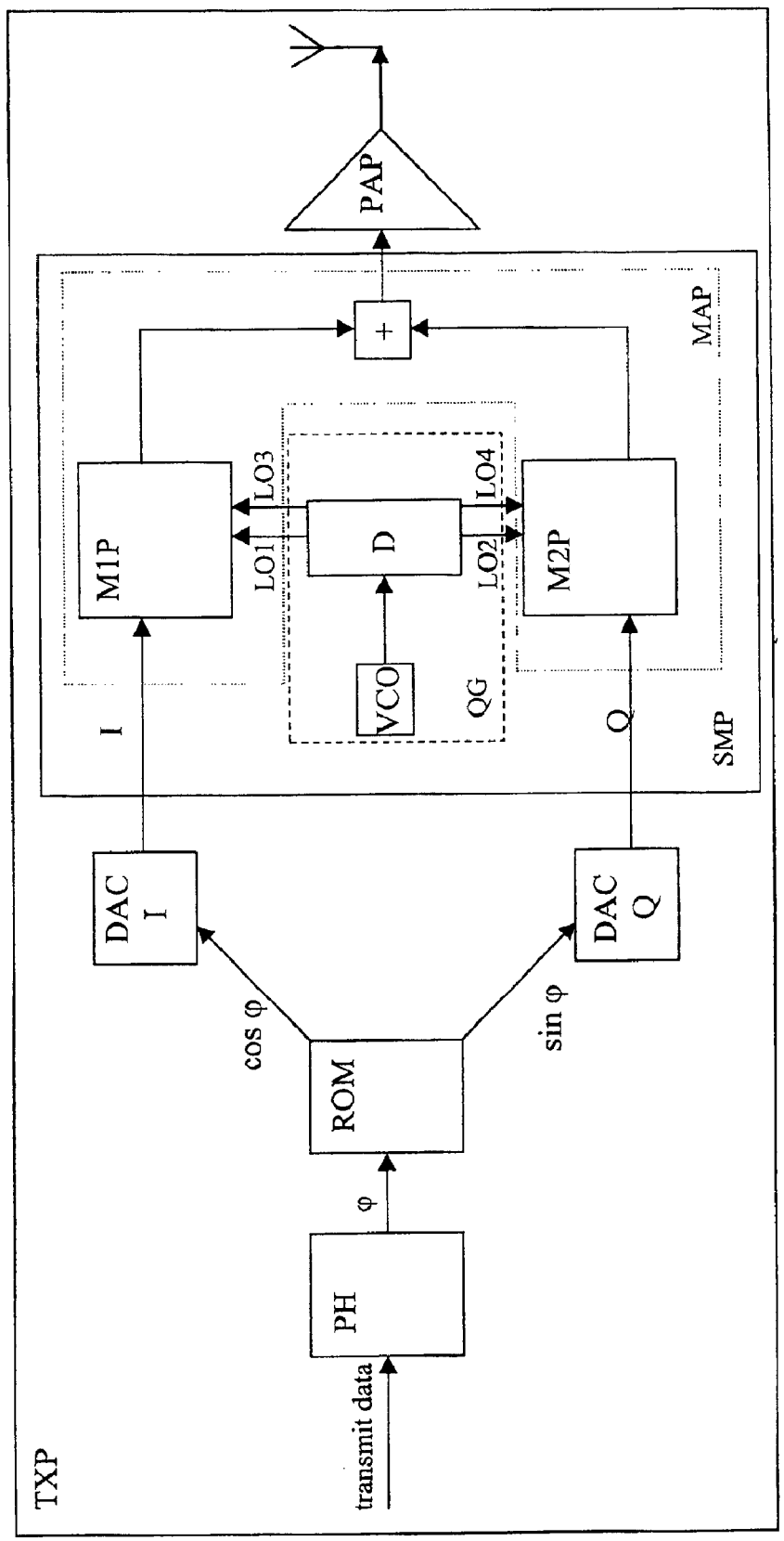
FIG. 1 shows a basic scheme of a prior art zero-IF transmitter TXP including a prior art signal modulator SMP.

A signal modulator of the present invention is for instance used in GSM and UMTS zero-IF applications. Traditional zero-IF transmitters, such as those shown in FIG. 1, are comprised of a phase accumulator circuit, denoted PH, which receives the transmit data under the form of a digital input signal, at 270 kbit/sec for GSM applications and at 3840 kbit/sec for UMTS applications, and derives from it the phase $\phi$, according to the GMSK or QPSK principles, respectively. The transmit data originates from a transmit data source (not shown in FIG. 1), which in GSM transmitters may comprise a microphone, A/D converters, filters, speech processors, encoders and encryptors. The phase signal $\phi$ is the symbol that will be transmitted. In traditional zero-IF GSM transmitters, this phase signal is further transformed into its I and Q coordinates as the cosine and the sine values of this phase. Both values are provided in a digital form from a ROM table, which thus has two digital outputs, each respectively providing the $\cos(\phi)$ and the $\sin(\phi)$ in a digital form. This digital information is transformed into an analog baseband or phase information signal in D/A converters, DACI and DACQ, which are followed by two mixers M1P and M2P. The mixers M1P and M2P respectively multiply the two analog baseband components, denoted I and Q, of the analog baseband signal with a high frequency carrier. This frequency is 900 MHz for GSM, and 3.58 GHz for UMTS applications. The carrier sinewaves in both mixers differ from each other in that they have a 90° phase shift with respect to each other. LO1 is the reference high-frequency sinewave at 0°, LO2 is at 90°, LO3 at 180° and LO4 at 270°. These four high-frequency carriers are generated by a quadrature generator QG, which in general comprises a reference voltage controlled oscillator denoted VCO, followed by a divider circuit D as shown in FIG. 1. The output signals of the two multipliers, being components of a high-frequency phase vector, are added, thereby obtaining the vector sum of two Cartesian components. This is the high-frequency phase vector which, in the prior art case, also corresponds to the high-frequency output signal which is to be transmitted, after being amplified by the power amplifier PAP.

Both mixers and the summation circuit, indicated by a "+", constitute the prior art multiplier arrangement MAP, whereas this prior art multiplier arrangement, together with the quadrature generator QG, comprise the prior art signal modulator, denoted SMP.

Figure 2:
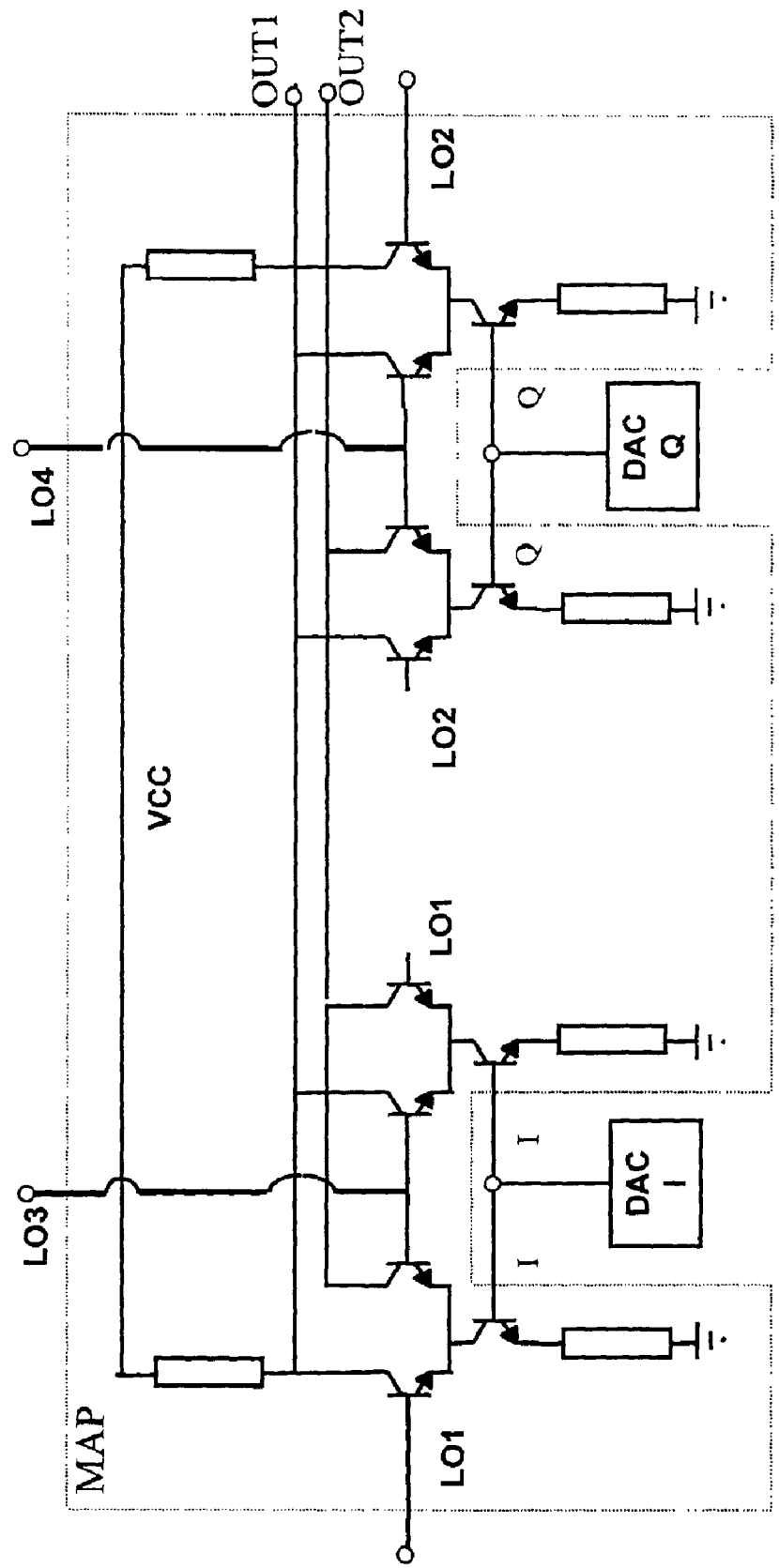
FIG. 2 shows a detailed implementation at transistor level of a prior art multiplier arrangement MAP included in the prior art signal modulator SMP.

A possible implementation at transistor level of such a prior art signal modulator SMP is shown in FIG. 2. Both mixers M1P and M2P are comprised of a Gilbert-cell multiplier. FIG. 2 shows a fully differential implementation, providing a differential output signal between two output terminals OUT1 and OUT2. Since this solution is well known and described in several tutorial handbooks, its operation is considered to be known by a person skilled in the art and will accordingly not be further discussed.

This solution requires two D/A converters, and two ROM tables, possibly integrated within one ROM: one for delivering the sine component, and a second for the cosine component of the phase $\phi$. Moreover, due to the Cartesian construction of the waveform afterwards, both Gilbert cell multipliers are continuously active, leading to a lot of power consumption in the 12 transistors depicted in FIG. 2. Another drawback of this system is that these multipliers themselves produce harmonics and noise and perform an image rejection. Due to the still non-perfect image rejection (about −30 dB), still amplitude modulation components are present. These can cause phase modulation in non-linear power amplifiers, which is to be avoided. A very linear power amplifier is thus mandatory for finally amplifying the generated signal before transmitting it via an antenna. This power amplifier is denoted PAP in FIG. 1. Class B or class AB power amplifiers are very linear, but consume a lot of power. The prior art transmitter TXP is thus very power hungry.

Figure 3:
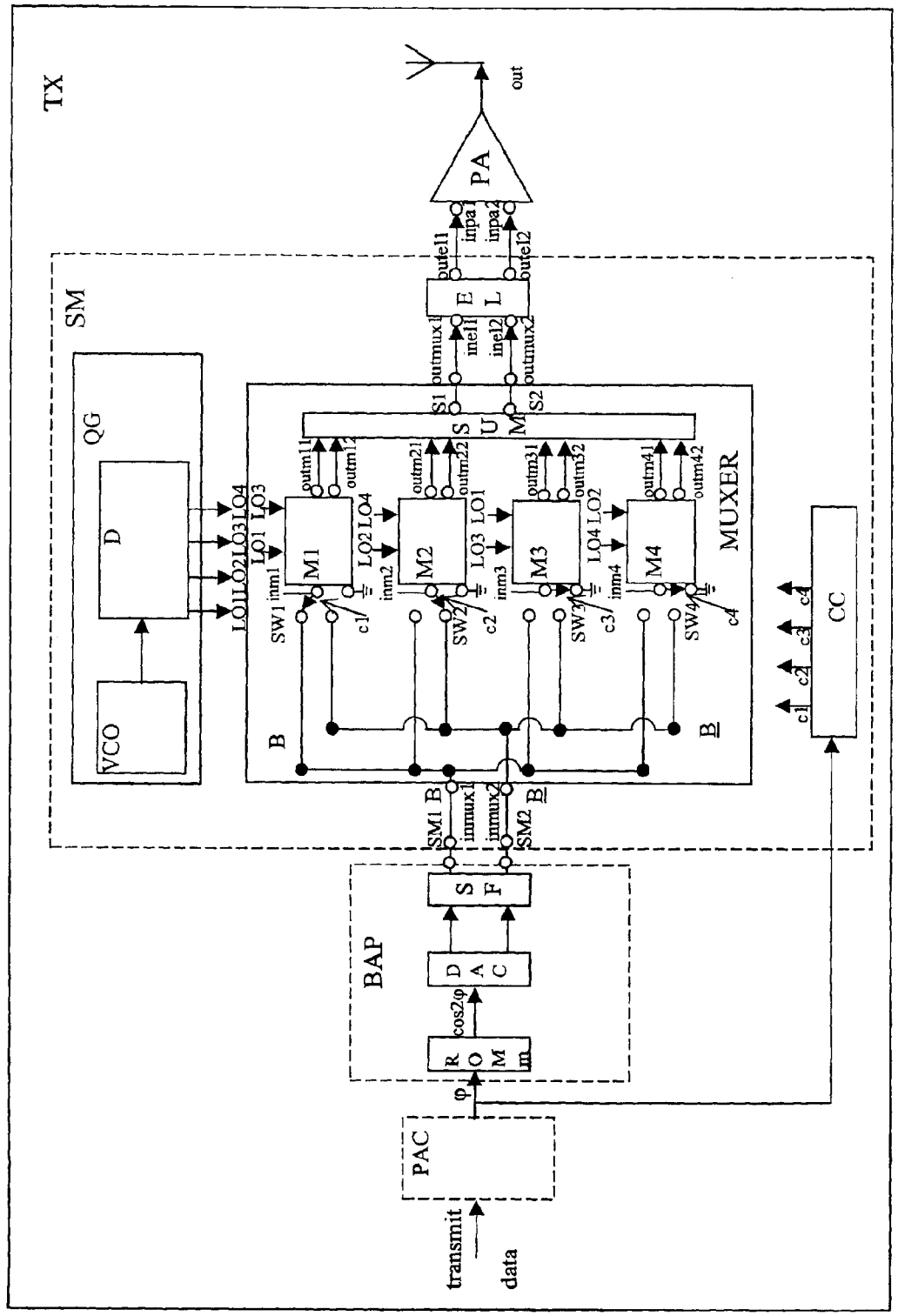
FIG. 3 shows a basic scheme of a transmitter TX including a signal modulator SM, a multiplier arrangement MUXER, as well as an analog pulse shaper BAP according to the invention.

The transmitter TX including the signal modulator SM of the present invention, and depicted in FIG. 3, is much more power efficient. This not only results from the fact that only one D/A converter is used instead of two, but also that a power efficient power amplifier, such as a class C amplifier, can now be used. Moreover, fewer transistors of the multiplier arrangement MUXER included in SM are active during the operation of the system, as compared to the number of active transistors of the Gilbert Cell multipliers of the signal modulator SMP of the prior art. Furthermore, this system also requires less chip area for the transmitter compared to the prior art solution. This is clear from the fact that only one D/A converter is used, but also only one ROM table is required. The extra circuitry required with respect to the prior art consists of the control circuit CC, and the envelope limiter EL, which only requires few transistors. The total solution thus consumes much less chip area.

The transmitter TX comprising the signal modulator SM of the present invention further comprises a phase accumulator circuit, denoted PAC, which can be the same as the prior art phase accumulator circuit PH. This phase accumulator circuit PAC receives the digital baseband signal or transmit data, which were provided by the transmit data source (not shown on FIG. 3). This PAC device derives from it the phase symbols φ, in accordance to GMSK or QPSK modulation principles. This phase information is transformed into two analog balanced signals within an analog pulse shaper denoted BAP. By definition, two signals are balanced if their sum always equals a constant DC non-zero value. An example of two such balanced signals are c+k.sin (a.φ) and c−k.sin(a.φ), with c, k, and a being constants, but other geometrical functions of the phase such as c+k.cos (a.φ) and c−k.cos(a.φ) can be used.

For the remainder of the disclosure, the following two balanced signals will be used: 0.5*VDD+0.5*VDD*cos(2φ) and 0.5*VDD−0.5*VDD*cos(2φ) whereby VDD is the value of the supply voltage Vcc of the complete signal modulator SM.

In FIG. 3, these balanced signals are denoted B and B̲.

Various embodiments exist for generating these two analog balanced signals. A first possibility comprises of first calculating or obtaining the cosine of 2φ, followed by a multiplication by 0.5*VDD, by an eventual sign operation and by an addition of 0.5.VDD. This can be done by means of a digital signal processor DSP, or may be performed in different steps. Afterwards, the obtained digital signals have to be converted into an analog one within D/A converters. A more cost-effective implementation, depicted in FIG. 3, comprises of getting the value of the cos(2φ), for instance from a ROM, denoted ROMm. This signal can be input to a fully balanced D/A converter, denoted DAC, which then generates from it automatically two balanced signals, with peak cosine values between its positive and negative supplies. These balanced signals are of the above mentioned form if the ground reference voltage is taken as the negative power supply of this D/A converter DAC. The balanced output signal can optionally be filtered in a smoothing filter denoted SF also part of the analog pulse shaper BAP, before delivering it to the two output terminals of this BAP circuit. These output terminals are coupled to respective input terminals SM1 and SM2 of the signal modulator SM. This signal modulator, besides comprising a quadrature generator QG, further comprises a multiplier arrangement MUXER as well as a control circuit CC. The multiplier arrangement MUXER comprises four two-quadrant multipliers, denoted M1 to M4, whereby the operation of each of these two-quadrant multipliers is controlled by a respective switch, denoted SW1 to SW4 in FIG. 3. These switches are controlled by respective control signals, denoted c1 to c4, which are obtained from the control circuit CC. One of the terminals of the respective switches SW1 to SW4 is coupled to the respective signal input terminal inm1 to inm4 of the multipliers M1 to M4. These switches control whether the input signal of one multiplier is either B, B̲, or whether this input terminal will be grounded, thereby turning this multiplier off. The operation of this control circuit as well as the respective control of the switches will be discussed in a further paragraph.

The respective single multipliers, M1 to M4, each further receive high-frequency modulation carrier input signals. These waveforms are denoted as LO1 to LO4 and differ from each other in that these are shifted with 90° phase shift from each multiplier to the next. In FIG. 3, a full differential implementation is shown, whereby multiplier M1 thus receives a differential high-frequency reference sinewave, composed of LO1 and LO3, multiplier M2 receives this reference sinewave, shifted at 90° and denoted LO2, LO4, the next one, LO3, LO1 is shifted 180° with respect to the first one LO1, LO3; whereas LO4, LO2 is shifted 270° with respect to LO1, LO2.

These four high frequency carriers are generated within a quadrature generator circuit QG. This may comprise a voltage controlled oscillator VCO delivering a reference waveform at twice the modulation frequency, followed by a divider circuit D. However, other implementations also exist as is well known to a person skilled in the art. The high frequency modulation frequencies for LO1 to LO4 are 900 and 1800 MHz for GSM and DCS, and 2400 MHz for UMTS.

The switches control the operation of the multipliers such that each time only two single multipliers are active, in contrast to the prior art whereby an equivalent of 4 of these simple two-quadrant multipliers are continuously active.

The output signals, provided at differential output terminal pairs respectively denoted outm11 and outm12, outm21 and outm22, outm31 and outm32, outm41 and outm42 for the four multipliers, are further added in a summing circuit, denoted SUM in FIG. 3 and included in the multiplier arrangement MUXER. This summing circuit provides a differential output signal between its pair of output terminals S1 and S2, which are coupled to the pair of output terminals outmux1 and outmux2 of the multiplier arrangement. Before being amplified within the power amplifier PA, this differential output signal first has to be modified in a device denoted EL, being a constant envelope limiter. The respective input terminals inel1 and inel2 of EL are therefore coupled to the respective output terminals of the multiplier arrangement, whereby the output terminals outel1 and outel2 of the envelope limiter are further coupled to the respective input terminals inpa1 and inpa2 of the power amplifier PA.

Figure 4:
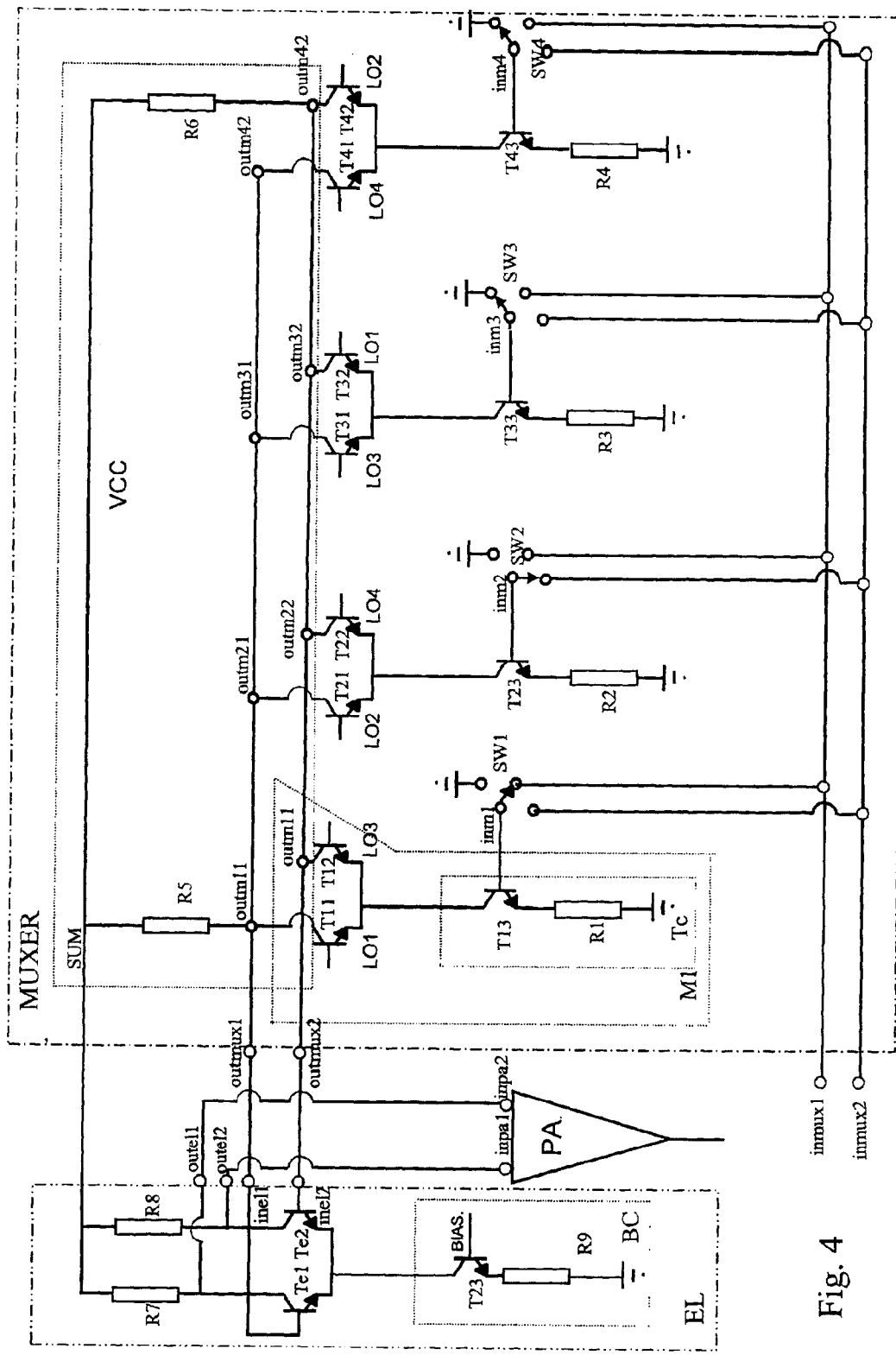
FIG. 4 shows a more detailed embodiment of the multiplier arrangement MUXER and the envelope limiter EL of the signal modulator SM of FIG. 3, and FIG. 5 schematically explains how the high-frequency phase vector is mathematically synthesized within the MUXER circuit of FIG. 3 or 4.

A more detailed implementation of this MUXER, as depicted in FIG. 4, will now be discussed in conjunction with its operation. Although an implementation using bipolar transistors is shown, also other chip technologies such as GaAs or CMOS can be used.

As already mentioned, the MUXER circuit comprises 4 single simple two-quadrant emitter-coupled pair multipliers M1 to M4, of which only M1 is explicitly indicated as such in FIG. 4 in order not to overload the drawing. M1 is comprised of transistors T11 and T12 in a differential pair configuration, their tail current being provided by a transconductor circuit TC comprising a transistor T13 in series with an emitter or source degeneration resistor R1 as is shown in FIG. 4. The control voltage of this transconductor circuit is provided to the control terminal of this transistor T13, which is further coupled to the input terminal inm1 of the multiplier M1. Similarly, M2 comprises differential pair transistors T21 and T22, their emitters or sources being coupled to the collector or drain of transistor T23 of which the emitter or source is coupled to the ground terminal via emitter degeneration resistor R2. The control terminal of T23 is thereby coupled to the input terminal inm2 of multiplier M2. M3 comprises, in a similar way, transistors T31, T32, T33 and resistor R3, whereas M4 comprises transistors T41, T42 and T43, and resistor R4. Each of the four differential pairs receives, at its two inputs, two components of a differential sinewave composed of local oscillator sinewaves. These are LO1 and LO3 for M1, LO2 and LO4 for M2, LO3 and LO1 for M3 and LO4 and LO2 for M4. The collectors or drains of T11, T21, T31 and T41 are coupled to each other, thereby comprising a first summing node, in the embodiment depicted in FIG. 4 comprising an output terminal of the summing circuit as well as an output terminal outmux1 of the multiplier arrangement. Similarly, the collectors or drains of T12, T22, T32 and T42 are coupled to each other, thereby comprising a second summing node, in this embodiment as well comprising another output terminal of the summing circuit and of the multiplier arrangement, this output terminal being denoted outmux2. Both summing nodes are also coupled via resistors R5 and R6 of the summing circuit to the supply voltage terminal VCC. Outmux1 and outmux2 are also further coupled to respective input terminals inpa1 and inpa2 of the power amplifier PA, via a constant envelope limiter EL.

Signal input terminals inm1 to inm4 of all 4 single balanced mixers M1 to M4 are coupled, via respective controllable switches SW1, SW2, SW3 and SW4, to either input terminal inmux1 or input terminal inmux2 or either to the ground reference terminal. On the respective input terminals inmux1 and inmux2, the two balanced analog phase information signals B and $\underline{B}$ are respectively provided. As shown in FIG. 3, the four switches SW1 to SW4 are respectively controlled by control signals c1 to c4, which were provided by a control circuit CC. These control signals are such that at each moment, only one of the four mixers receives the B signal, another one of these four mixers receives the $\underline{B}$ signal, and the two remaining mixers have their signal input coupled to the ground reference terminal. In FIGS. 3 and 4, the situation is shown where the control input of M1 receives the B signal provided at inmux1, whereas the control input of M2 receives the $\underline{B}$ signal provided at inmux2. The control inputs of M3 and M4 are coupled to the ground.

Figure 5:
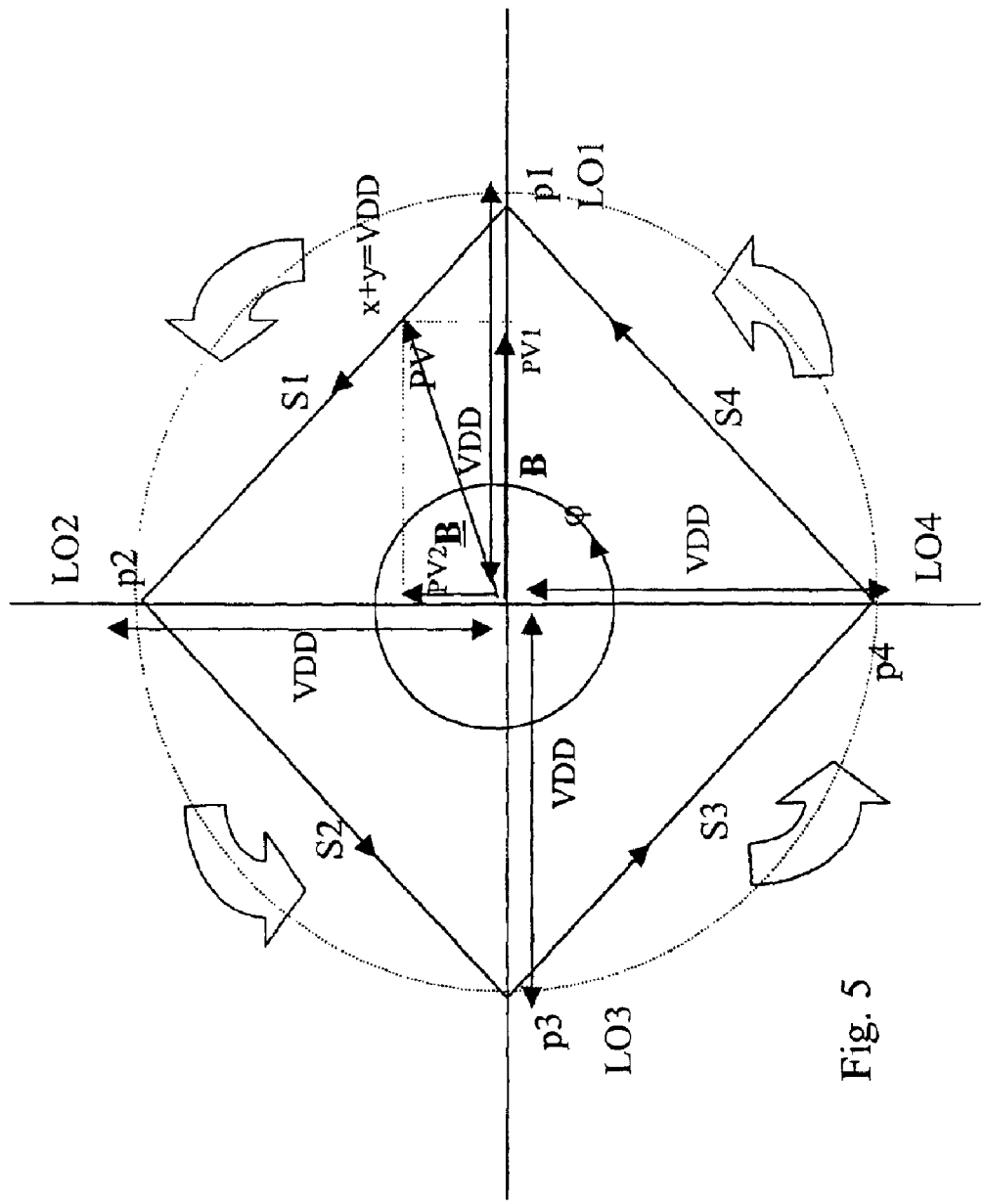

Transistors T13 and T32 thereby receive at their respective control input terminal two balanced signals, their sum being VDD, which respectively vary in accordance to the input voltages B and $\underline{B}$. These signals can therefore be expressed as $0.5VDD+0.5VDD.\cos(2\phi)$ and $0.5VDD-0.5VDD.\cos(2\phi)$. These signals are multiplied with the differential LO signals. Since the LO signals at the inputs of the differential pairs of the multipliers comprise a differential high-frequency signal, and if we consider the left one of each differential input signal as the reference for representing the corresponding wave vector in the complex plane, two successive ones of these multipliers thereby define a quadrant in the complex plane. For the example depicted in FIGS. 3–5, this is the quadrant determined by M1 and M2, thus between LO's LO1 and LO2. By the operation of both multipliers M1 and M2, two vectors components are obtained: a first one, being LO1 multiplied with the value of B, and a second, being LO2 multiplied with the value of $\underline{B}$. This is schematically represented in FIG. 5, whereby the component from M1 is denoted BV1 having an amplitude B, and whereby the component of M2 is denoted BV2, with an amplitude $\underline{B}$. The sum of both vectors components is a high-frequency vector which varies in the first quadrant of the complex plane, according to the mathematical equation $x+y=VDD$. This is because the sum of the balanced signals is VDD, and provided that the modulus of the high frequency sinewaves equals one. In order to make an excursion over this complete line S1 in the first quadrant of the complex z-plane, the signals B and $\underline{B}$ both have to perform an excursion between 0 and VCC. Since this line has to correspond to the phase vector $\phi$ performing an excursion of 90° as prescribed by the GMSK code, the $\cos(2\phi)$ is used instead of the $\cos(\phi)$ for the derivation of the signals B and $\underline{B}$. In case the phase vector shifts further 90° during a next symbol period, an excursion on contour S2 of the square within the next quadrant is to be performed. In case the phase vector shifts back 90°, an excursion on the already followed side S1 in the same quadrant is to be followed, but now in the opposite direction. Changing direction within one quadrant, as well as performing an excursion within the next quadrant, is obtained by means of the control of the switches. These four quadrants of the complex plane are determined by resp. LO1-LO2, LO2-LO3, LO3-LO4 and LO4-LO1.

In the example depicted in FIG. 5, the phase continuously shifts further 90° such as to perform a full excursion of 360°. Initially, the first quadrant is followed, as was obtained by the control of the switches as depicted in FIG. 4. An excursion on the side S1 of the square is then performed by the resulting high frequency phase vector between points p1 and p2. At point p2, the phase information is such that a following quadrant is selected in the complex plane, which has to result in an excursion by the high frequency phase vector along side S2 of this square. In the MUXER circuit, switch SW1 is controlled such as to couple the control input of T13 to the ground. SW2 is controlled such that inm2, coupled to the control input of T23, is now coupled to inmux1 and no longer to inmux2. At the same time, SW3 is controlled such that inm3, which is coupled to the control input of T33, is now coupled to inmux2, whereas SW4 is left unchanged, inm4 thus remaining coupled to the ground reference level. From the moment the switches are set as such, the resulting high frequency phase vector is determined by the quadrants defined by M2 and M3, thus the quadrant between LO2 and LO3. The resulting high-frequency phase vector thus makes an excursion over the side S2 of the square, from point p2, to point p3. When during a next symbol period, the phase signal still has to move another 90°, SW1 will remain at ground, SW2 will be controlled such as to couple inm2 to ground, SW3 will be controlled such as to couple inm3 to inmux1, whereas SW4 will be controlled such as to couple inm4 to INMUX2. The resulting high-frequency phase vector is now determined by the quadrant LO3-LO4, thus will follow side S3 of the square, from points p3 to p4. And, if during the next symbol period the phase still turns 90° further, side S4 is to be followed on the square, from p4 to p1, determined by the quadrant LO4-LO1. Multiplier M1 is thereby receiving signal $\underline{B}$, multipliers M2 and M3 are turned off, whereas multiplier M4 is receiving signal B.

In case the phase had shifted continuously between + and −90°, only one quadrant is used, whereby the already active multipliers are switched between inmux1 and inmux2 during subsequent periods of the symbol. In the assumption that originally side S1 was used between points p1 and p2, this same side is now followed between points p2 and p1 during the next symbol period.

All other excursions the high-frequency phase vector can make for the GMSK coding scheme can be obtained as a combination from the above mentioned examples. The control of the switches is thereby crucial and is obtained from control circuit CC. This can comprise a look-up table, whereby the next position of the different switches is indicated as a function of their current position and of the evolution of the symbol itself. This can be pre-computed and thus stored as a read-only memory, and can easily be retrieved from a pointer or address which is itself a function of the phase signal $\phi$.

Until now, only the GMSK coding schemes were covered. This is the scheme used for GSM and DCS applications. For the signal modulator to be able to further comply with the QPSK modulation scheme, as required in UMTS applications, an additional excursion of the high-frequency phase vector is to be foreseen, namely an excursion via a diagonal of the square. This is accomplished in another way: during a diagonal transition between p1 and p3 or p2 and p4, the signal on inmux1 and inmux2 is temporarily frozen on the values corresponding to p1 and p2, or p3 and p4 respectively. This may be accomplished by means of a latch in the analog pulse shaper, between the ROMm and the DAC (not shown in FIG. 3) The diagonal transition is now controlled by the switches in the following way: for a transition from p1 to p3, during the first half period of the transition SW1 is connected to inmux1 and the inmux1 signal is constant at the maximum (VDD) value. SW3 is connected to inmux2 and inmux2 is at the minimum (0) value. Half way, the transition SW1 is switched from inmux1 to inmux2 and SW3 is switched from inmux2 to inmux1. All other diagonal transitions can be obtained in a similar way.

The sudden transition halfway the diagonal traject, is however not acceptable in practical systems because the abrupt change has a high harmonic content exceeding the available bandwidth. For this purpose, an AM control signal cos(4φ) is taken from ROMm (not shown) and is input, via an additional D/A converter (not shown on FIG. 3) to a power control input of this power amplifier (also not shown in FIG. 3) The amplitude of the output vector of the power amplifier is thereby smoothly shaped according to a raised cosine shape, derived from this cos(4φ), to make the zero crossing of the output vector at the switchover point between SW1 and SW3. Such techniques of additional modulating the signal of the power amplifier is already known to a person skilled in the art and will accordingly not be further explained in this document Since, in all of the cases, a maximum of two of the four multipliers are active within the MUXER, less noise is generated compared to the multiplier arrangement of the prior art. Moreover, it is clear that the present invention concerns a direct phase modulation without image rejection requirements of the baseband circuit, in contrast to the Cartesian I/Q modulators which perform an additional image rejection. Such direct VCO modulation avoids the image components in the output spectrum of the to-be-transmitted signal. Therefore, a non-linear, and consequently more power efficient, power amplifier can be used, such as a class C amplifier.

The output signal of the MUXER circuit is a high-frequency phase vector that is moving on the square, according to a first category of predetermined transitions of the phase relating to the GMSK encoding scheme, or on the diagonal of the square, according to a second category of predetermined transitions of the phase. Nevertheless, according to GSM specifications, the vector to be transmitted for this first category of predetermined transitions of the phase signal, has to move on a circle, thus being of constant amplitude. In order to transform the square to the circle, as is also shown in FIG. 5, an envelope limiter is put in series with the multiplier arrangement. This envelope limiter is denoted EL in FIG>3 and is included in the signal modulator SM. EL comprises two input terminals inel1 and inel2, to which the differential output signal of the MUXER is provided, and which are therefore coupled to the output terminals outmux1 and outmux2 of the multiplier arrangement. The output terminals outel1 and outel2 of this envelope limiter EL are coupled to respective input terminals inpa1 and inpa2 of the power amplifier PA. In FIG. 4, an embodiment of such an envelope limiter is depicted. This embodiment includes again a differential pair of transistors Te1 and Te2, of which the control terminals comprise the input terminals of EL. The collectors or drains of these transistors are coupled to the supply voltage terminal VCC via resistors R7 and R8. The emitters or sources of these transistors are coupled together and to the collector or drain of a bias transistor Te3 which, in this depicted embodiment, comprises the output terminal of a bias circuit BC. The emitter or source of this bias transistor is coupled to the ground reference terminal via another resistor R9. The function of such a bias transistor in series with the resistor R9 is to provide a DC bias current for the EL circuit. The differential input signal at the control input terminals of Te1 and Te2 which thus corresponds to the output signal of the MUXER is such that the current through the resistors R7 and R8 takes the full tail current of R9, thereby clamping the output signal to the VDD voltage of the supply. In this way, the output signal appearing between output terminals outel1 and outel2 is having a constant amplitude, being VDD, but still has the correct phase information. This vector is thus again compliant to the GMSK modulation standard of constant envelope, and different phase.

While the principles of the invention have been described above in connection with specific apparatus, it is to be clearly understood that this description is made only by way of example and not as a limitation on the scope of the invention.

What is claimed is:

1. A multiplier arrangement comprising a pair of input terminals that receive analog phase information, said multiplier arrangement receiving a set of high-frequency local oscillator signals which are phase-shifted 90 degrees with respect to each other, said multiplier arrangement generating, from said analog phase information and from said high-frequency local oscillator signals, components of a high-frequency phase vector and synthesizing said high-frequency phase vector from said components within a summing means, wherein said multiplier arrangement receives a set of differential high frequency local oscillator signals and provides said high-frequency phase vector as a vector that is making an excursion alongside the contours of a square within a complex plane during a first category of predetermined transitions of a phase signal on which said analog phase information is dependent, said multiplier arrangement further comprising:

a pair of output terminals on which said high-frequency phase vector is output as a differential high-frequency phase vector;

a plurality of multipliers, each multiplier of said plurality having a respective input terminal that is coupled to a first terminal of an associated switch, a second terminal of said associated switch being coupled to one of said pair of input terminals of said multiplier arrangement or to a ground reference terminal under control of a respective control signal; and a set of control input terminals to which said respective control signals are provided.

2. The multiplier arrangement according to claim 1, wherein said multiplier arrangement provides said high-frequency phase vector as a vector that is making an excursion alongside the diagonals of said square during a second category of predetermined transitions of said phase signal, said second category being different from said first category.

3. The multiplier arrangement according to claim 1, wherein said multipliers of said plurality of multipliers deliver respective ones of said components of said high-frequency phase vector.

4. The multiplier arrangement according to claim 1, wherein a multiplier of said plurality of multipliers comprises a differential pair of transistors, wherein respective control terminals of said transistors receive respective components of a differential high-frequency local oscillator signal of said set of differential high-frequency local oscillator signals, respective first conductive terminals of said transistors of said differential pair are coupled to the output terminal of a transconductor circuit of which an input terminal is coupled to said respective input terminal of said multiplier, and respective second conductive terminals of said transistors of said differential pair being coupled to input terminals of said summing means.

5. The multiplier arrangement according to claim 4, wherein said transconductor circuit comprises a transistor, a control terminal of which is coupled to said input terminal of said transconductor circuit, a first conductive terminal of which is coupled to the ground reference terminal via an impedance device, and a second conductive terminal of which is coupled to said output terminal of said transconductor circuit.

6. A signal modulator that generates a high-frequency output signal from analog phase information, said signal modulator comprising:

a pair of input terminals that receive said analog phase information, a quadrature generator that generates a set of high-frequency local oscillator signals which are phase-shifted 90 degrees with respect to each other, a multiplier arrangement according to claim 1 that receives said analog phase information and said set of high-frequency local oscillator signals and generates therefrom a high-frequency phase vector, wherein, said signal modulator further comprises an envelope limiter that transforms said high-frequency phase vector into said high-frequency output signal.

7. A transmitter comprising:

a transmit data source that delivers transmit data;

a phase accumulator that determines a phase signal from said transmit data;

an analog pulse shaper that generates analog phase information from said phase signal, wherein said analog phase information is generated as two balanced analog signals;

a signal modulator according to claim6 that generates a high-frequency output signal from said analog phase information; and a power amplifier that amplifies said high-frequency output signal for further transmission to a receiver.

8. A transmitter according to claim 7, wherein said analog pulse shaper comprises a read-only memory device coupled to a digital-analog converter.

9. The signal modulator according to claim 1, wherein said signal modulator further comprises a control circuit that receives said phase signal and derives therefrom said respective control signals.

10. The signal modulator according to claim 9, wherein said control circuit generates said respective control signals so that at most two of said multipliers of said plurality of multipliers are coupled to a respective one of said pair of input terminals of said multiplier arrangement.

11. A signal modulator according to claim 10, wherein said envelope limiter comprises a differential pair of transistors, respective control terminals of which are coupled to said pair of output terminals of said multiplier arrangement, respective first conductive terminals of which are coupled to the output terminal of a bias circuit, and respective second conductive terminals of which are coupled to a pair of differential output terminals of said envelope limiter and to a supply voltage terminal impedance devices.

12. A multiplier arrangement comprising:

a plurality of multipliers that receives at least two analog phase information signals and a set of differential high-frequency local oscillator signals that are phase-shifted 90 degrees with respect to each other, wherein each multiplier comprises an input switch that is coupled to one of said analog phase information signals or to a ground reference terminal under control of a respective control signal, said multiplier arrangement generating, from said analog phase information and from said high-frequency local oscillator signals, components of a high-frequency phase vector; and a summing circuit that synthesizes said high-frequency phase vector from said components, wherein said high-frequency phase vector is a vector that is making an excursion alongside the contours of a square within a complex plane during a first category of predetermined transitions of a phase signal on which said analog phase information is dependent.

13. The multiplier arrangement according to claim 12, wherein said multiplier arrangement provides said high-frequency phase vector as a vector that is making an excursion alongside the diagonals of said square during a second category of predetermined transitions of said phase signal, said second category being different from said first category.

14. A signal modulator that generates a high-frequency output signal, said signal modulator comprising:

a quadrature generator that generates a set of high-frequency local oscillator signals, which are phase-shifted 90 degrees with respect to each other;

a multiplier arrangement according to claim 12 that receives said analog phase information signals and said set of high-frequency local oscillator signals and generates therefrom a high-frequency phase vector; and an envelope limiter that transforms said high-frequency phase vector into said high-frequency output signal.

15. The signal modulator according to claim 14, wherein said signal modulator further comprises a control circuit that receives said phase signal information signals and derives therefrom said respective control signals for said multipliers.

16. The signal modulator according to claim 15, wherein said control circuit generates said respective control signals so that at most two of said multipliers of said plurality of multipliers are coupled to one of said phase signal information signals.

17. A transmitter comprising:

a transmit data source that delivers transmit data;

a phase accumulator that determines a phase signal from said transmit data;

an analog pulse shaper that generates analog phase information from said phase signal, wherein said analog phase information is generated as two balanced analog signals;

a signal modulator according to claim 14 that generates a high-frequency output signal from said analog phase information; and a power amplifier that amplifies said high-frequency output signal for further transmission to a receiver.

18. A transmitter according to claim 17, wherein said analog pulse shaper comprises a read-only memory device coupled to a digital-analog converter.

* * * * *